(12) United States Patent
Jung et al.

(10) Patent No.: US 12,708,005 B2
(45) Date of Patent: Aug. 11, 2026

(54) DRIVING CIRCUIT MOUNTING FILM

(71) Applicant: SAMSUNG ELECTRONICS CO., LTD., Suwon-si (KR)

(72) Inventors: Jae-Min Jung, Suwon-si (KR); Narae Shin, Suwon-si (KR); Jeong-Kyu Ha, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 224 days.

(21) Appl. No.: 18/596,324

(22) Filed: Mar. 5, 2024

(65) Prior Publication Data

US 2025/0062211 A1 Feb. 20, 2025

(30) Foreign Application Priority Data

Aug. 16, 2023 (KR) ........................ 10-2023-0107046

(51) Int. Cl.
*H10W 70/65* (2026.01)
*H10W 70/63* (2026.01)

(52) U.S. Cl.
CPC ......... *H10W 70/65* (2026.01); *H10W 70/635* (2026.01)

(58) Field of Classification Search
CPC ......... H01L 23/49827; H01L 23/49838; H01L 23/4985; H05K 1/189; H05K 1/147; H05K 2201/09236; H05K 2201/10128
USPC .......................................................... 174/262
See application file for complete search history.

(56) References Cited

U.S. PATENT DOCUMENTS

| | | | |
|---|---|---|---|
| 7,948,768 | B2 | 5/2011 | Park et al. |
| 8,228,677 | B2 | 7/2012 | Kunimatsu et al. |
| 9,177,904 | B2 | 11/2015 | Jung et al. |
| 9,305,990 | B2 | 4/2016 | Jung et al. |
| 9,818,732 | B2 | 11/2017 | Jung et al. |
| 10,789,869 | B2 | 9/2020 | Jeon et al. |
| 10,840,175 | B2 | 11/2020 | Koo |
| 11,189,207 | B2 | 11/2021 | Jeon et al. |
| 2009/0231823 | A1 | 9/2009 | Kunimatsu et al. |
| 2010/0149775 | A1 | 6/2010 | Park et al. |
| 2013/0293816 | A1 | 11/2013 | Jung et al. |
| 2014/0300849 | A1 | 10/2014 | Jung et al. |

(Continued)

FOREIGN PATENT DOCUMENTS

| | | |
|---|---|---|
| KR | 10-1942918 | 1/2019 |
| KR | 10-2019-0080203 | 7/2019 |
| KR | 10-2022-0087754 | 6/2022 |

*Primary Examiner* — Timothy J Thompson
*Assistant Examiner* — Michael F Mcallister
(74) *Attorney, Agent, or Firm* — MORGAN, LEWIS & BOCKIUS LLP

(57) ABSTRACT

A driving circuit mounting film according to an embodiment includes: a base film that has a first surface and a second surface facing each other with a thickness therebetween; a driving circuit portion that is on the first surface of the base film; a plurality of first signal lines that are on a first side region on one side of the driving circuit portion along a first direction; and a plurality of second signal lines that are on a second side region on the opposite side of the driving circuit portion along the first direction. A first width of the first side region and a second width of the second side region are different from each other, and the first signal line includes a first portion on the first surface of the base film and a second portion on the second surface of the base film.

16 Claims, 14 Drawing Sheets

(56) References Cited

U.S. PATENT DOCUMENTS

| | | | | |
|---|---|---|---|---|
| 2015/0060931 | A1* | 3/2015 | Jung | H10H 29/10 257/773 |
| 2016/0020196 | A1 | 1/2016 | Jung et al. | |
| 2016/0218065 | A1* | 7/2016 | Ha | H10W 70/688 |
| 2018/0049324 | A1 | 2/2018 | Koo et al. | |
| 2019/0206295 | A1 | 7/2019 | Jeon et al. | |
| 2019/0287888 | A1 | 9/2019 | Koo | |
| 2020/0394946 | A1 | 12/2020 | Jeon et al. | |
| 2023/0170356 | A1* | 6/2023 | Li | H05K 1/189 257/59 |
| 2023/0209709 | A1* | 6/2023 | Wu | H10D 86/441 361/679.01 |

* cited by examiner

DRIVING CIRCUIT MOUNTING FILM

CROSS-REFERENCE TO RELATED APPLICATION

This application claims priority under 35 U.S.C. § 119 to Korean Patent Application No. 10-2023-0107046 filed at the Korean Intellectual Property Office on Aug. 16, 2023, and all the benefits accruing therefrom, the entire contents of which are incorporated herein by reference.

BACKGROUND

1. Field

The present disclosure relates to a driving circuit mounting film or an IC mounting film.

2. Description of the Related Art

In order to transfer a driving signal to a display device, a plurality of signal lines of the display device may be connected to a chip on film (COF).

As a resolution of the display device increases, the number of signal lines connected to the chip on film increases. As the number of signal lines connected to the chip on film increases, a size of the chip on film increases. However, as a size of a bezel of the display device decreases, it is necessary to reduce the size of the chip on film at which the desired number of signal lines is formed.

SUMMARY

Embodiments provide a driving circuit mounting film or an IC mounting film that does not increase in size while allowing a plurality of signal lines to be located on the chip on film.

However, problems to be solved by the embodiments are not limited to the above-described problem and may be variously extended in a range of technical ideas included in the embodiments.

A driving circuit mounting film according to an embodiment includes: a base film that has a first surface and a second surface facing each other with a thickness therebetween; a driving circuit portion on the first surface of the base film; a plurality of first signal lines on a first side region on one side of the driving circuit portion along a first direction; and a plurality of second signal lines on a second side region on the opposite side of the driving circuit portion along the first direction. A first width of the first side region and a second width of the second side region are different from each other, and the first signal line includes a first portion on the first surface of the base film and a second portion on the second surface of the base film.

The plurality of first signal lines and the plurality of second signal lines may not be connected to the driving circuit portion.

The first width may be greater than the second width.

The plurality of second signal lines may be on the first surface of the base film.

The base film may have a plurality of holes, and the first portion and the second portion of the first signal line may be connected to each other through the plurality of holes.

The plurality of holes may be disposed along a direction parallel to the first direction.

A virtual first line passing through the plurality of holes may be a straight line parallel to the first direction.

The plurality of holes may be disposed along an oblique direction with respect to the first direction.

A virtual second line passing through the plurality of holes may be a straight line parallel to the oblique direction.

The plurality of holes may not be disposed in a line.

A virtual third line passing through the plurality of holes may not be a straight line.

The number of the plurality of first signal lines may be different from the number of the plurality of second signal lines.

The number of the plurality of first signal lines may be greater than the number of the plurality of second signal lines.

The first width may be about 1.5 times to about 4.5 times the second width. The first width may be about three times the second width.

The driving circuit mounting film may further include a plurality of third signal lines on the first surface of the base film and connected to the driving circuit portion.

The base film may have a plurality of holes, and the first portion and the second portion of the first signal line may be connected to each other through the plurality of holes.

The plurality of holes may be disposed along a direction parallel to the first direction.

The plurality of holes may be disposed along an oblique direction with respect to the first direction.

The plurality of holes may not be disposed in a line.

According to the embodiments, a driving circuit mounting film that does not increase in size while allowing a plurality of signal lines to be disposed, may be provided.

DETAILED DESCRIPTION

Figure 1:
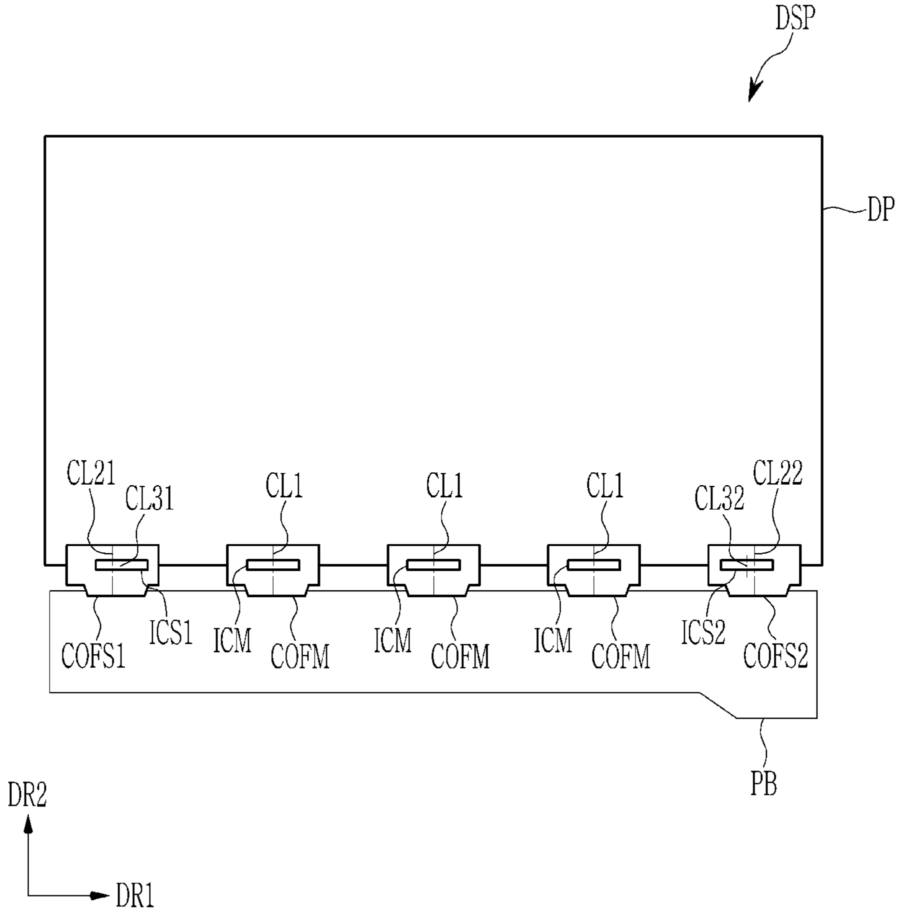
FIG. 1 is a plan view of a display device including a driving circuit mounting film (or an IC mounting film), according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure and claims.

In order to clearly describe the present disclosure, parts or portions that are irrelevant to the description are omitted, and identical or similar constituent elements throughout the specification are denoted by the same reference numerals.

Furthermore, the accompanying drawings are provided to allow embodiments disclosed in the present specification to be easily understood and are not to be interpreted as limiting the claims or embodiments disclosed in the present specification. It is to be understood that the present disclosure includes all modifications, equivalents, and substitutions without departing from the scope and spirit of the present disclosure.

Furthermore, in the drawings, the size and thickness of each element are arbitrarily illustrated for ease of illustration and description, and the present disclosure is not necessarily limited to those features illustrated in the drawings. In the drawings, the thicknesses of layers, films, panels, regions, areas, etc., may be exaggerated for clarity.

It will be understood that when an element such as a layer, film, region, area, or substrate is referred to as being "on" or "above" another element, it may be directly on the other element or intervening elements may also be present. In contrast, when an element is referred to as being "directly on" another element, there are no intervening elements present. Furthermore, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Furthermore, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other.

Hereinafter, various embodiments and variations will be described in detail with reference to the drawings.

Referring to FIG. 1, a display device DSP, including a plurality of driving circuit mounting films, according to an embodiment, will be described. FIG. 1 is a plan view of the display device, including the driving circuit mounting film (or an IC mounting film), according to an embodiment.

Referring to FIG. 1, the display device DSP may include a display panel DP, including a plurality of pixels, a plurality of driving circuit mounting films COFS1, COFM, and COFS2 connected to the display panel DP, and a driving circuit board (a driving circuit substrate) PB connected to the plurality of driving circuit mounting films COFS1, COFM, and COFS2. The driving circuit board PB may be adjacent to the display panel DP with the driving circuit mounting films COFS1, COFM, and COFS2 between the driving circuit board PB and the display panel DP.

The display panel DP may extend in a first direction DR1 and in a second direction DR2 that is different from the first direction DR1, and the plurality of driving circuit mounting films COFS1, COFM, and COFS2 may be located along one edge of the display panel DP extending in the first direction DR1. However, the embodiment is not limited thereto.

The plurality of driving circuit mounting films COFS1, COFM, and COFS2 may include the first driving circuit mounting film COFS1 and the second driving circuit mounting film COFS2 positioned adjacent to both edges of the display panel DP along the first direction DR1 and a plurality of third driving circuit mounting films COFM located between the first driving circuit mounting film COFS1 and the second driving circuit mounting film COFS2.

The first driving circuit mounting film COFS1 may include a first driving circuit portion ICS1, the second driving circuit mounting film COFS2 may include a second driving circuit portion ICS2, and each of the plurality of third driving circuit mounting films COFM may include a third driving circuit portion ICM.

Each of third driving circuit portions ICM may be disposed at a central portion of each of the plurality of third driving circuit mounting films COFM along the first direction DR1. More specifically, a first center line CL1 passing through the central portion of each of the plurality of third driving circuit mounting films COFM and parallel to the second direction DR2 may pass through a central portion of each of the third driving circuit portions ICM, and may almost coincide with the first center line CL1 parallel to the second direction DR2.

The first driving circuit portion ICS1 may be positioned toward a first side of the first driving circuit mounting film COFS1 along the first direction DR1 in a central portion of the first driving circuit mounting film COFS1, and for example, the first driving circuit portion ICS1 may be located adjacent to the third driving circuit portion ICM. Similarly, the second driving circuit portion ICS2 may be positioned toward a second side facing the first side of the second driving circuit portion ICS2 along the first direction DR1 in a central portion of the second driving circuit mounting film COFS2, and for example, the second driving circuit portion ICS2 may be located adjacent to the third driving circuit portion ICM. A plurality of third driving circuit portions ICMs may be located between the first driving circuit portion ICS1 and the second driving circuit portion ICS2.

Along the first direction DR1, a second center line CL21 passing through the central portion of the first driving circuit mounting film COFS1 and parallel to the second direction DR2, may not coincide with a third center line CL31 passing through a central portion of the first driving circuit portion ICS1 and parallel to the second direction DR2. Similarly, a fourth center line CL22 passing through the central portion of the second driving circuit mounting film COFS2 and parallel to the second direction DR2, may not coincide with a fifth center line CL32 passing through a central portion of the second driving circuit portion ICS2 and parallel to the second direction DR2.

Figure 2:
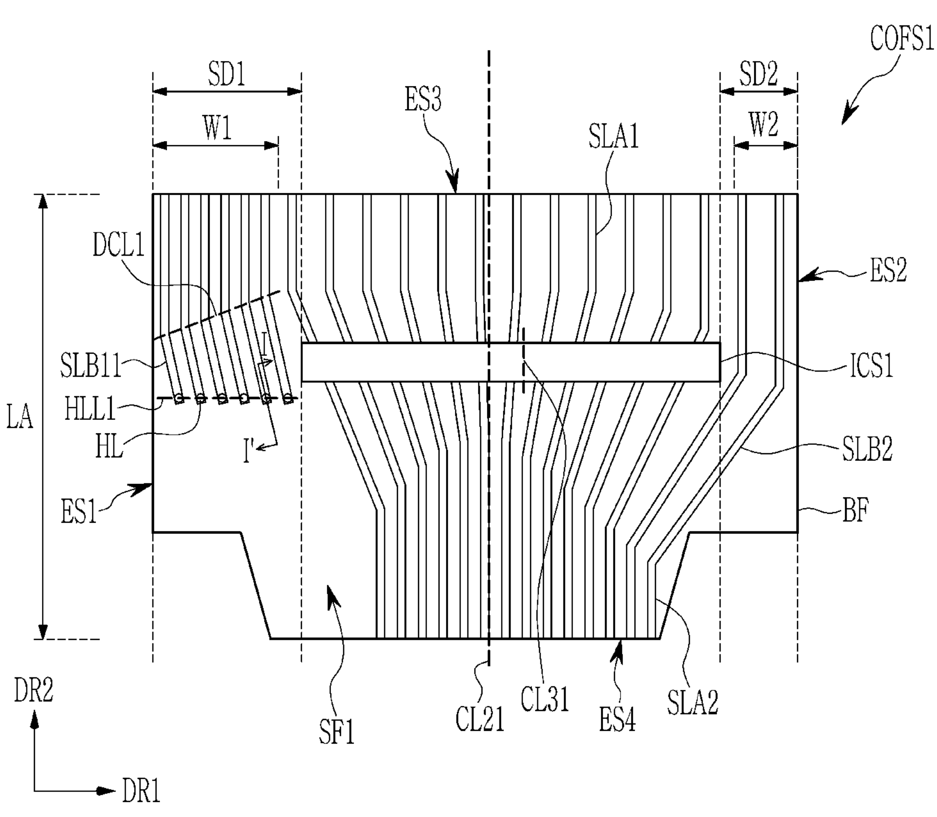
FIG. 2 is a plan view of a first surface of the driving circuit mounting film, according to an embodiment.

In reference to FIGS. 2 to 4, the first driving circuit mounting film COFS1, according to an embodiment will be described. FIG. 2 is a plan view of a first surface of the driving circuit mounting film according to an embodiment, FIG. 3 is a plan view of a second surface of the driving circuit mounting film according to an embodiment, and FIG. 4 is a cross-sectional view taken along a line I-I' of FIG. 2.

Figure 3:
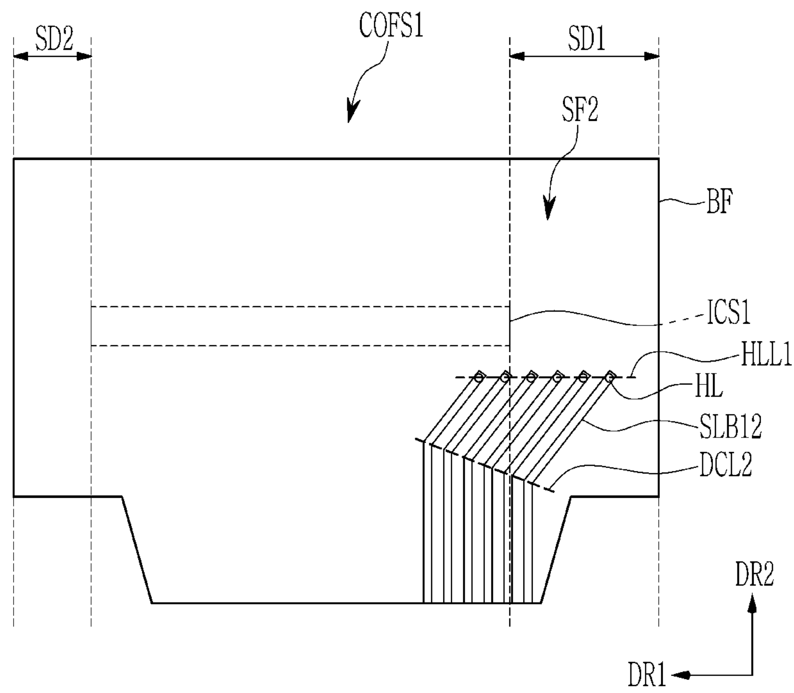
FIG. 3 is a plan view of a second surface of the driving circuit mounting film, according to an embodiment.
Figure 4:
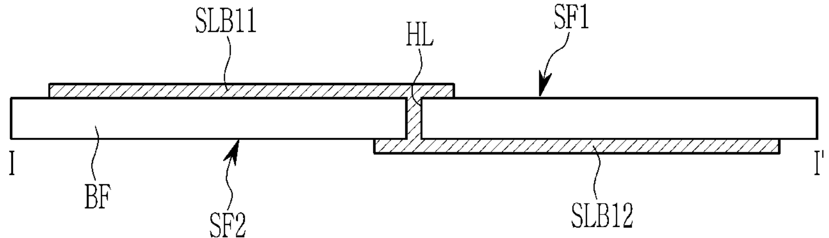
FIG. 4 is a cross-sectional view taken along a line I-I' of FIG. 2.

Referring to FIGS. 2 to 4, a base film BF of the first driving circuit mounting film COFS1 may include a first surface SF1 and a second surface SF2 facing each other with a thickness therebetween.

The base film BF of the first driving circuit mounting film COFS1 may include a first edge ES1 and a second edge ES2 on opposite sides of the first driving circuit mounting film COFS1 and facing each other along the first direction DR1, and a third edge ES3 and a fourth edge ES4 on opposite sides of the first driving circuit mounting film COFS1 and facing each other along the second direction DR2.

Referring to FIG. 2, the first driving circuit mounting film COFS1 may include the first driving circuit portion ICS1 disposed on the first surface SF1 of the base film BF, a plurality of first signal lines SLA1 and a plurality of second signal lines SLA2 connected to the first driving circuit portion ICS1, and a plurality of third signal lines SLB11 and a plurality of fourth signal lines SLB2 that are not connected to the first driving circuit portion ICS1.

The plurality of first signal lines SLA1 may be connected between the display panel DP and the first driving circuit portion ICS1 of FIG. 1 along the third edge ES3, and the plurality of second signal lines SLA2 may be connected between the first driving circuit portion ICS1 and the driving circuit board PB along the fourth edge ES4. The plurality of first signal lines SLA1 and the plurality of second signal lines SLA2 may be on opposite sides of the first driving circuit portion ICS1.

On a plane where the first driving circuit mounting film COFS1 is viewed from above, the plurality of third signal lines SLB11 may be disposed at a first side region (or a first side surface region) SD1 of the first driving circuit portion ICS1 along the first direction DR1, and the plurality of fourth signal lines SLB2 may be disposed at a second side region (or a second side surface region) SD2 of the first driving circuit portion ICS1 along the first direction DR1.

The plurality of third signal lines SLB11 can extend from the third edge ES3 to an interior region of the base film BF, but may not extend to the fourth edge ES4. The plurality of third signal lines SLB11 can extend along the first surface SF1 of the base film BF to a plurality of holes HL extending through the base film BF to the second surface SF2.

In various embodiments, the plurality of fourth signal lines SLB2 may extend from the third edge ES3 to the fourth edge ES4 along the first surface SF1 of the base film BF.

Along the first direction DR1, the second center line CL21 passing through the central portion of the first driving circuit mounting film COFS1 and parallel to the second direction DR2, may not coincide with the third center line CL31 passing through the central portion of the first driving circuit portion ICS1 and parallel to the second direction DR2.

A first width W1 of some regions of the base film BF, where the plurality of third signal lines SLB11 disposed at the first side region SD1 of the first driving circuit portion ICS1, may be wider than a second width W2 of some regions of the base film BF, where the plurality of fourth signal lines SLB2 disposed at the second side region SD2 of the first driving circuit portion ICS1. For example, the first width W1 may be about 1.5 times to about 4.5 times the second width W2, and more specifically, may be about 3 times the second width W2. However, the embodiment is not limited thereto.

wherein various embodiments, the number of the plurality of third signal lines SLB11 that are adjacent to an edge of the display device DSP on the base film BF of the first driving circuit mounting film COFS1 and are not connected to the first driving circuit portion ICS1, can be large. In other words, the number of the plurality of third signal lines SLB11 disposed at the first side region SD1 of the first driving circuit portion ICS1 may be greater than the number of the plurality of fourth signal lines SLB2 disposed at the second side region SD2 of the first driving circuit portion ICS1, and the plurality of third signal lines SLB11 may be disposed closer to an edge of the display panel DP than the plurality of fourth signal lines SLB2. In this case, the first width W1 of some regions of the base film BF where the plurality of third signal lines SLB11 disposed at the first side region SD1 of the first driving circuit portion ICS1 may be disposed may be wider than the second width W2 of some regions of the base film BF where the plurality of fourth signal lines SLB2 disposed at the second side region SD2 of the first driving circuit portion ICS1 may be disposed, so that it is possible to secure a region where the desired number of the third signal lines SLB11 may be disposed.

In various embodiments, the plurality of third signal lines SLB11 may be bent along a first direction change line DCL1 on the first surface SF1 of the base film BF.

In various embodiments, the plurality of fourth signal lines SLB2 may be bent twice on the first surface SF1 of the base film BF.

Referring to FIG. 3, the first driving circuit mounting film COFS1 may include a plurality of fifth signal lines SLB12 located on the second surface SF2 of the base film BF.

The plurality of fifth signal lines SLB12 may extend from the fourth edge ES4 toward an interior region of the base film BF, but may not extend to the third edge ES3. The plurality of fifth signal lines SLB12 can extend along the second surface SF2 of the base film BF to a plurality of holes HL extending through the base film BF to the first surface SF1. The plurality of fifth signal lines SLB12 may be electrically connected to the plurality of third signal lines SLB11.

In various embodiments, the plurality of fifth signal lines SLB12 may be bent along a second direction change line DCL2 on the second surface SF2 of the base film BF.

Referring to FIG. 4, the plurality of third signal lines SLB11 disposed on the first surface SF1 of the base film BF of the first driving circuit mounting film COFS1 may be connected to the plurality of fifth signal lines SLB12 disposed on the second surface SF2 of the base film BF through the plurality of holes HL in the base film BF.

Referring to FIG. 2 and FIG. 3, the plurality of holes HL for connecting the plurality of third signal lines SLB11 and the plurality of fifth signal lines SLB12 may be disposed almost in a line to be parallel to the first direction DR1. A virtual first line HLL1 passing through the plurality of holes HL may be parallel to the first direction DR1.

As described above, the first width W1 of some regions of the base film BF where the plurality of third signal lines SLB11 disposed on the first side region SD1 of the first driving circuit portion ICS1 may be wider than the second width W2 of some regions of the base film BF, where the plurality of fourth signal lines SLB2 are disposed on the second side region SD2 of the first driving circuit portion ICS1, so that it is possible to secure a region where the desired number of the third signal lines SLB11 may be disposed.

In addition, the plurality of third signal lines SLB11 may be bent once along the first direction change line DCL1 on the first surface SF1 of the base film BF, the plurality of fifth signal lines SLB12 may be bent once on the second surface SF2 of the base film BF, and the plurality of third signal lines SLB11 disposed on the first surface SF1 may be connected to the plurality of fifth signal lines SLB12 disposed on the second surface SF2 of the base film BF through the plurality of holes HL of the base film BF and may be additionally bent at a portion connected through the plurality of holes HL.

Therefore, even if the number of the plurality of signal lines SLB11 and SLB12 disposed at the first side region SD1 of the first driving circuit portion ICS1 increases, a large number of the signal lines SLB11 and SLB12 may be disposed at a peripheral region where the first driving circuit portion ICS1 is not disposed without an increase of a length LA measured along the second direction DR2 of the first driving circuit mounting film COFS1, as shown for example in FIG. 2.

In various embodiments, the number of the plurality of signal lines SLB11 and SLB12 disposed at the first side region SD1 of the first driving circuit portion ICS1 may be disposed at the peripheral region, where the first driving circuit portion ICS1 is not disposed, so that the plurality of signal lines SLB11 and SLB12 may have a shape bent along the second direction DR2, so as not to be connected to the first driving circuit portion ICS1. In general, when the plurality of signal lines have a shape that is bent multiple times, a length and a width of the base film BF may be increased to provide regions for the plurality of signal lines. However, the plurality of signal lines SLB11 and SLB12 that are disposed at the first side region SD1 of the first driving circuit portion ICS1 and are not connected to the first driving circuit portion ICS1, may include the plurality of third signal lines SLB11 disposed on the first surface SF1 of the base film BF and the plurality of fifth signal lines SLB12 disposed on the second surface SF2 of the base film BF. The plurality of third signal lines SLB11 and the plurality of fifth signal lines SLB12 may be connected to each other through the plurality of holes HL of the base film BF, where the plurality of signal lines may be formed with three bends. The number of the plurality of third signal lines SLB11 and the plurality of fifth signal lines SLB12 may be increased without increasing a region where the plurality of third signal lines SLB11 and the plurality of fifth signal lines SLB12 are disposed.

Figure 5:
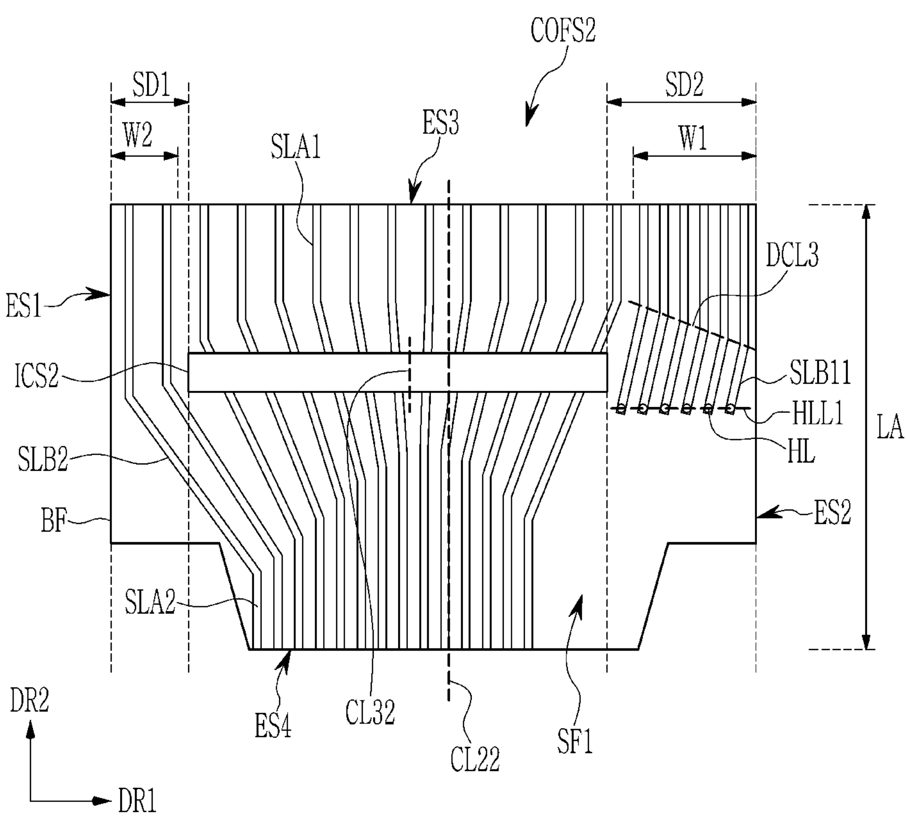
FIG. 5 is a plan view of a first surface of the driving circuit mounting film, according to an embodiment.

In reference to FIGS. 5 and 6, the second driving circuit mounting film COFS2, according to an embodiment will be described. FIG. 5 is a plan view of a first surface of the driving circuit mounting film, according to an embodiment, and FIG. 6 is a plan view of a second surface of the driving circuit mounting film, according to an embodiment.

Figure 6:
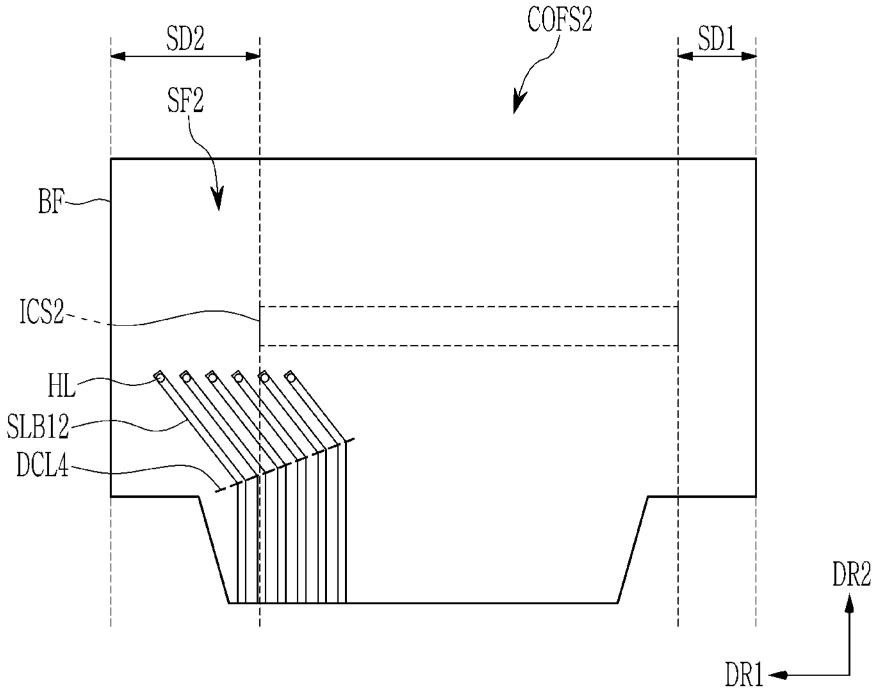
FIG. 6 is a plan view of a second surface of the driving circuit mounting film, according to an embodiment.

Referring to FIGS. 5 and 6, the second driving circuit mounting film COFS2 may be similar to the first driving circuit mounting film COFS1 described above.

Referring to FIG. 5, the second driving circuit mounting film COFS2 may include the second driving circuit portion ICS2 disposed on the first surface SF1 of the base film BF, the plurality of first signal lines SLA1 and the plurality of second signal lines SLA2 connected to the second driving circuit portion ICS2, and the plurality of third signal lines SLB11, and the plurality of fourth signal lines SLB2 that are not connected to the second driving circuit portion ICS2. The plurality of first signal lines SLA1 and the plurality of second signal lines SLA2 may be on opposite sides of the second driving circuit portion ICS2.

In various embodiments, the plurality of first signal lines SLA1 may be connected between the display panel DP and the second driving circuit portion ICS2 of FIG. 1 along the third edge ES3, and the plurality of second signal lines SLA2 may be connected between the second driving circuit portion ICS2 and the driving circuit board PB along the fourth edge ES4.

Unlike the first driving circuit mounting film COFS1, on a plane where the second driving circuit mounting film COFS2 is viewed from above, the plurality of third signal lines SLB11 may be disposed at a second side region SD2 of the second driving circuit portion ICS2 along the first direction DR1, and the plurality of fourth signal lines SLB2 may be disposed at a first side region SD1 of the second driving circuit portion ICS2 along the first direction DR1.

In various embodiments, the plurality of third signal lines SLB11 may extend from the third edge ES3 to an interior region of the base film BF, but may not extend to the fourth edge ES4. The plurality of third signal lines SLB11 can extend along the first surface SF1 of the base film BF to a plurality of holes HL extending through the base film BF to the second surface SF2.

In various embodiments, the plurality of fourth signal lines SLB2 may extend from the third edge ES3 to the fourth edge ES4 along the first surface SF1 of the base film BF.

Along the first direction DR1, the fourth center line CL22 passing through the second driving circuit mounting film COFS2 and parallel to the second direction DR2, may not coincide with the fifth center line CL32 passing through the second driving circuit portion ICS2 and parallel to the second direction DR2.

A first width W1 of some regions of the base film BF where the plurality of third signal lines SLB11 disposed at the second side region SD2 of the second driving circuit portion ICS2 may be wider than a second width W2 of some regions of the base film BF, where the plurality of fourth signal lines SLB2 disposed at the first side region SD1 of the second driving circuit portion ICS2. For example, the first width W1 may be about 1.5 times to about 4.5 times the second width W2, and more specifically, may be about 3 times the second width W2. However, the embodiment is not limited thereto.

In various embodiments, the number of the plurality of third signal lines SLB11 disposed at the second side region SD2 of the second driving circuit portion ICS2 may be greater than the number of the plurality of fourth signal lines SLB2 disposed at the first side region SD1 of the second driving circuit portion ICS2. The first width W1 of some regions of the base film BF where the plurality of third signal lines SLB11 are disposed may be wider than the second width W2 of some regions of the base film BF where the plurality of fourth signal lines SLB2 are disposed.

In various embodiments, the plurality of third signal lines SLB11 may be bent along a third direction change line DCL3 on the first surface SF1 of the base film BF.

In various embodiments, the plurality of fourth signal lines SLB2 may be bent twice on the first surface SF1 of the base film BF.

Referring to FIG. 6, the first driving circuit mounting film COFS1 may include the plurality of fifth signal lines SLB12 disposed on the second surface SF2 of the base film BF.

In various embodiments, the plurality of fifth signal lines SLB12 may extend from the fourth edge ES4 to an interior region of the base film BF, but may not extend to the third edge ES3.

In various embodiments, the plurality of fifth signal lines SLB12 may be bent along a fourth direction change line DCL4 on the second surface SF2 of the base film BF.

In various embodiments, the plurality of third signal lines SLB11 disposed on the first surface SF1 of the base film BF of the second driving circuit mounting film COFS2 may be connected to the plurality of fifth signal lines SLB12 disposed on the second surface SF2 of the base film BF through the plurality of holes HL of the base film BF.

In various embodiments, the plurality of holes HL for connecting the plurality of third signal lines SLB11 and the plurality of fifth signal lines SLB12 may be in a line parallel to the first direction DR1, where the virtual first line HLL1 passing through the plurality of holes HL may be parallel to the first direction DR1.

According to the various embodiments, the first width W1 of some regions of the base film BF, where the plurality of third signal lines SLB11 disposed at the second side region SD2 of the second driving circuit portion ICS2 may be wider than the second width W2 of some regions of the base film BF where the plurality of fourth signal lines SLB2 on the first side region SD1 of the second driving circuit portion ICS2 may be disposed, so that it is possible to secure the region where the desired number of the third signal lines SLB11 may be disposed. In addition, the plurality of signal lines SLB11 and SLB12 disposed at the second side region SD2 of the second driving circuit portion ICS2 may include the plurality of third signal lines SLB11 disposed on the first surface SF1 of the base film BF and the plurality of fifth signal lines SLB12 disposed on the second surface SF2 of the base film BF, and the plurality of third signal lines SLB11 and the plurality of fifth signal lines SLB12 may be connected to each other through the plurality of holes HL of the base film BF. Thus, even if the number of the plurality of signal lines SLB11 and SLB12 disposed at the second side region SD2 of the second driving circuit portion ICS2 increases, a large number of the signal lines SLB11 and SLB12 may be disposed without an increase of a length LA measured along the second direction DR2 of the second driving circuit mounting film COFS2.

Another embodiment will be described with reference to FIGS. 7 to 10.

Figure 7:
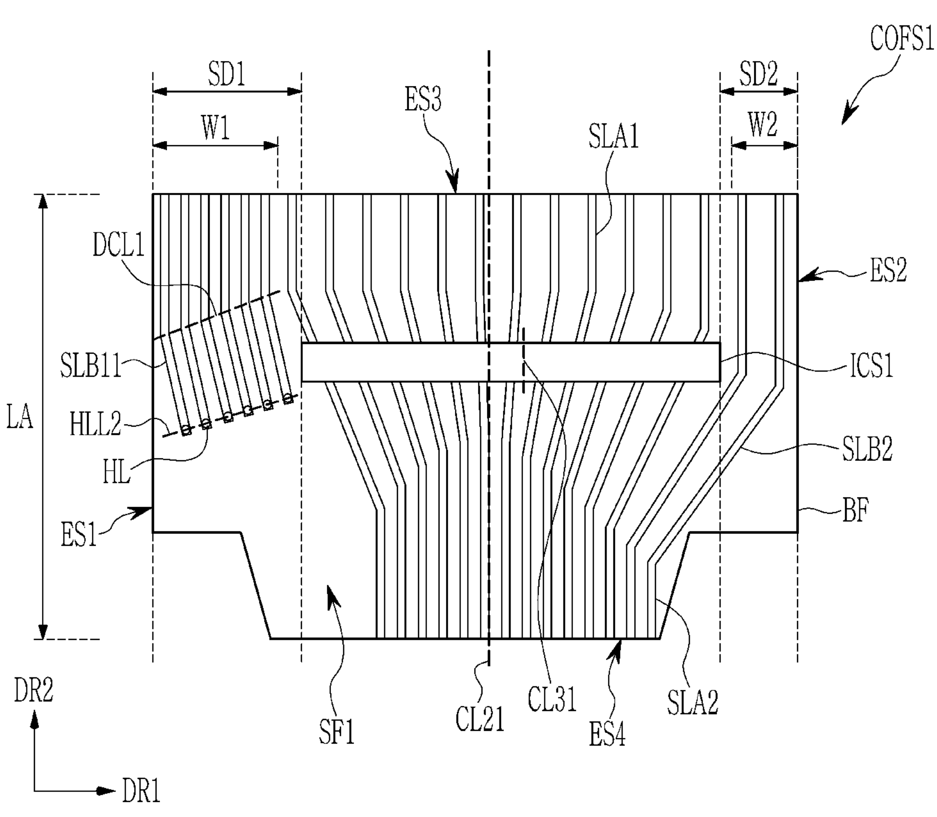
FIG. 7 is a plan view of a first surface of the driving circuit mounting film, according to another embodiment.
Figure 8:
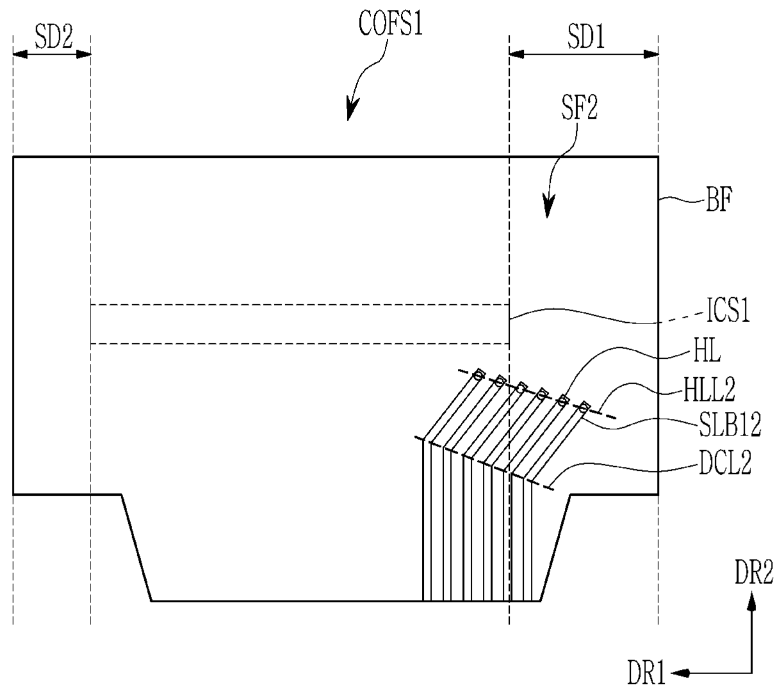
FIG. 8 is a plan view of a second surface of the driving circuit mounting film, according to another embodiment.

Referring to FIG. 7 and FIG. 8, the first driving circuit mounting film COFS1 according to another embodiment will be described. FIG. 7 is a plan view of a first surface of the driving circuit mounting film according to another embodiment, and FIG. 8 is a plan view of a second surface of the driving circuit mounting film according to another embodiment.

Referring to FIG. 7 and FIG. 8, the first driving circuit mounting film COFS1 according to the present embodiment is similar to the first driving circuit mounting film COFS1 according to the embodiments previously described with reference to FIGS. 2 to 4.

Referring to FIG. 7, the first driving circuit mounting film COFS1 may include the first driving circuit portion ICS1 disposed on the first surface SF1 of the base film BF, the plurality of first signal lines SLA1 and the plurality of second signal lines SLA2 connected to the first driving circuit portion ICS1, and the plurality of third signal lines SLB11 and the plurality of fourth signal lines SLB2 that are not connected to the first driving circuit portion ICS1.

On the plane where the first driving circuit mounting film COFS1 is viewed from above, the plurality of third signal lines SLB11 may be in the first side region SD1 of the first driving circuit portion ICS1 extending along the first direction DR1, and the plurality of fourth signal lines SLB2 may be in the second side region SD2 of the first driving circuit portion ICS1 extending along the first direction DR1.

In various embodiments, the plurality of third signal lines SLB11 may extend from the third edge ES3 to an interior region of the base film BF, but may not extend to the fourth edge ES4.

In various embodiments, the plurality of fourth signal lines SLB2 may extend from the third edge ES3 to the fourth edge ES4.

Along the first direction DR1, the second center line CL21 passing through the first driving circuit mounting film COFS1 and parallel to the second direction DR2, may not coincide with the third center line CL31 passing through the first driving circuit portion ICS1 and parallel to the second direction DR2.

In various embodiments, the first width W1 of some regions of the base film BF where the plurality of third signal lines SLB11 disposed at the first side region SD1 of the first driving circuit portion ICS1 may be wider than the second width W2 of some regions of the base film BF where the plurality of fourth signal lines SLB2 disposed at the second side region SD2 of the first driving circuit portion ICS1 may be disposed.

In various embodiments, the plurality of third signal lines SLB11 may be bent along the first direction change line DCL1 on the first surface SF1 of the base film BF.

In various embodiments, the plurality of fourth signal lines SLB2 may be bent twice on the first surface SF1 of the base film BF.

Referring to FIG. 8, the first driving circuit mounting film COFS1 may include the plurality of fifth signal lines SLB12 disposed on the second surface SF2 of the base film BF.

In various embodiments, the plurality of fifth signal lines SLB12 may extend from the fourth edge ES4 toward the base film BF, but may not extend to the third edge ES3. The plurality of fifth signal lines SLB12 can extend along the second surface SF2 of the base film BF to a plurality of holes HL extending through the base film BF to the first surface SF1. The plurality of fifth signal lines SLB12 may be electrically connected to the plurality of third signal lines SLB11.

In various embodiments, the plurality of fifth signal lines SLB12 may be bent along the second direction change line DCL2 on the second surface SF2 of the base film BF.

In various embodiments, the plurality of third signal lines SLB11 disposed on the first surface SF1 of the base film BF of the first driving circuit mounting film COFS1 may be connected to the plurality of fifth signal lines SLB12 disposed on the second surface SF2 of the base film BF through the plurality of holes HL in the base film BF.

Referring to FIG. 7 and FIG. 8, unlike the first driving circuit mounting film COFS1, according to the embodiments previously described with reference to FIGS. 2 to 4, the plurality of holes HL for connecting the plurality of third signal lines SLB11 and the plurality of fifth signal lines SLB12 may be disposed almost in a line (aligned) along an oblique direction with respect to the first direction DR1 in the first driving circuit mounting film COFS1, according to the present embodiment. A virtual second line HLL2 passing through the plurality of holes HL may form a predetermined angle with the first direction DR1 and the second direction DR2.

According to the various embodiments, the first width W1 of some regions of the base film BF, where the plurality of third signal lines SLB11 are disposed at the first side region SD1 of the first driving circuit portion ICS1 may be wider than the second width W2 of some regions of the base film BF, where the plurality of fourth signal lines SLB2 are disposed in the second side region SD2 of the first driving circuit portion ICS1. In addition, the plurality of signal lines SLB11 and SLB12 disposed at the first side region SD1 of the first driving circuit portion ICS1 may include the plurality of third signal lines SLB11 disposed on the first surface SF1 of the base film BF and the plurality of fifth signal lines SLB12 disposed on the second surface SF2 of the base film BF, where the plurality of third signal lines SLB11 and the plurality of fifth signal lines SLB12 may be connected to each other through the plurality of holes HL of the base film BF. Thus, even if the number of the plurality of signal lines SLB11 and SLB12 disposed at the first side region SD1 of the first driving circuit portion ICS1 increases, a large number of the signal lines SLB11 and SLB12 may be disposed without an increase of a length LA measured along the second direction DR2 of the second driving circuit mounting film COFS2.

Many features of the driving circuit mounting film according to the embodiments previously described with reference to FIGS. 1 to 4 are all applicable to the driving circuit mounting film according to the present embodiment.

Figure 9:
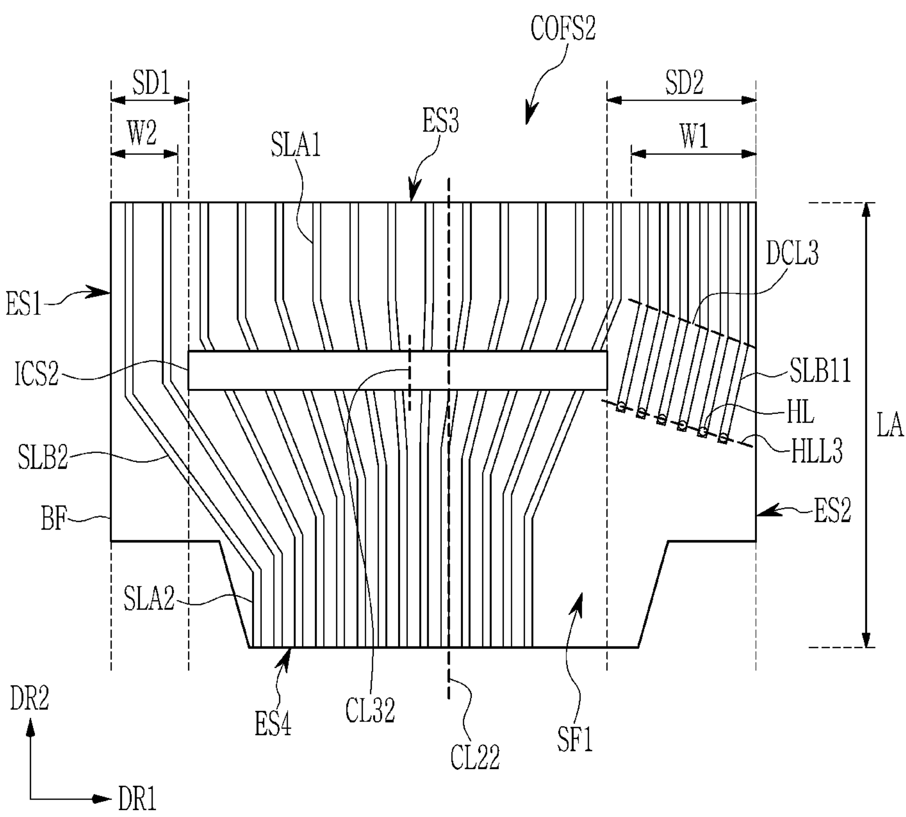
FIG. 9 is a plan view of a first surface of the driving circuit mounting film, according to another embodiment.
Figure 10:
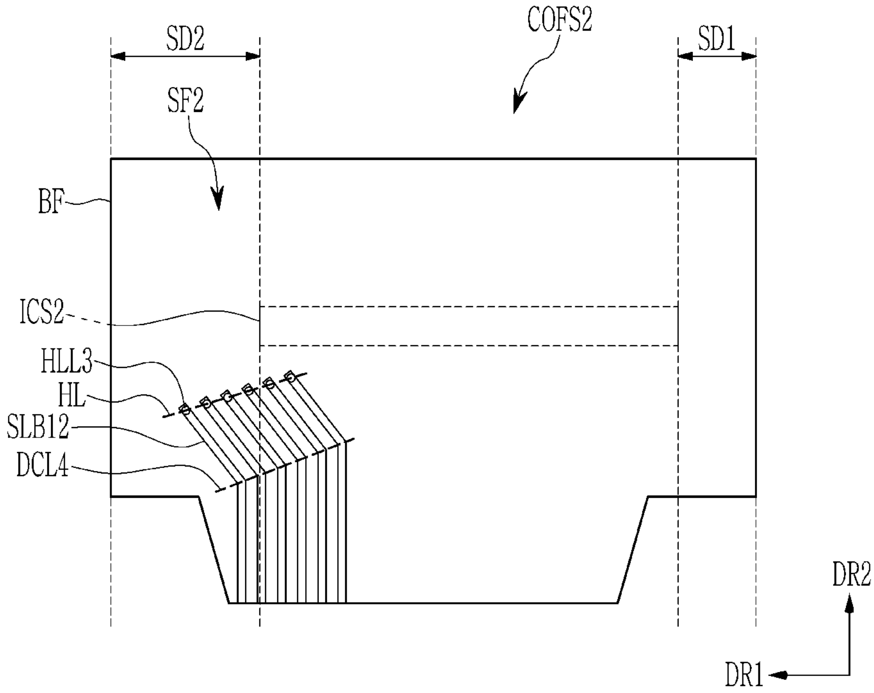
FIG. 10 is a plan view of a second surface of the driving circuit mounting film, according to another embodiment.

Referring to FIG. 9 and FIG. 10, the second driving circuit mounting film COFS2 according to another embodiment will be described. FIG. 9 is a plan view of a first surface of the driving circuit mounting film according to another embodiment, and FIG. 10 is a plan view of a second surface of the driving circuit mounting film according to another embodiment.

Referring to FIG. 9 and FIG. 10, the second driving circuit mounting film COFS2 according to the embodiment may be similar to the second driving circuit mounting film COFS2 according to the embodiments previously described with reference to FIGS. 5 and 6.

Referring to FIG. 9, the second driving circuit mounting film COFS2 may include the second driving circuit portion ICS2 disposed on the first surface SF1 of the base film BF, the plurality of first signal lines SLA1 and the plurality of second signal lines SLA2 connected to the second driving circuit portion ICS2, and the plurality of third signal lines SLB11 and the plurality of fourth signal lines SLB2 that are not connected to the second driving circuit portion ICS2.

In various embodiments, the plurality of first signal lines SLA1 may be connected between the display panel DP and the second driving circuit portion ICS2 of FIG. 1 along the third edge ES3, and the plurality of second signal lines SLA2 may be connected between the second driving circuit portion ICS2 and the driving circuit board PB along the fourth edge ES4.

Unlike the first driving circuit mounting film COFS1, on the plane where the second driving circuit mounting film COFS2 is viewed from above, the plurality of third signal lines SLB11 may be disposed at the second side region SD2 of the second driving circuit portion ICS2 along the first direction DR1, and the plurality of fourth signal lines SLB2 may be disposed at the first side region SD1 of the second driving circuit portion ICS2 along the first direction DR1.

In various embodiments, the plurality of third signal lines SLB11 may extend from the third edge ES3 toward the base film BF, but may not extend to the fourth edge ES4.

In various embodiments, the plurality of fourth signal lines SLB2 may extend from the third edge ES3 to the fourth edge ES4.

Along the first direction DR1, the fourth center line CL22 passing through the second driving circuit mounting film COFS2 and parallel to the second direction DR2, may not coincide with the fifth center line CL32 passing through the second driving circuit portion ICS2 and parallel to the second direction DR2.

In various embodiments, the first width W1 of some regions of the base film BF, where the plurality of third signal lines SLB11 are disposed at the second side region SD2 of the second driving circuit portion ICS2 may be wider than the second width W2 of some regions of the base film BF, where the plurality of fourth signal lines SLB2 are disposed at the first side region SD1 of the second driving circuit portion ICS2.

In various embodiments, the number of the plurality of third signal lines SLB11 disposed at the second side region SD2 of the second driving circuit portion ICS2 may be greater than the number of the plurality of fourth signal lines SLB2 disposed at the first side region SD1 of the second driving circuit portion ICS2. Therefore, it is possible to secure a region where the relatively large number of the third signal lines SLB11 may be disposed.

In various embodiments, the plurality of third signal lines SLB11 may be bent along the third direction change line DCL3 on the first surface SF1 of the base film BF.

In various embodiments, the plurality of fourth signal lines SLB2 may be bent twice on the first surface SF1 of the base film BF.

Referring to FIG. 10, the first driving circuit mounting film COFS1 may include the plurality of fifth signal lines SLB12 disposed on the second surface SF2 of the base film BF.

In various embodiments, the plurality of fifth signal lines SLB12 may extend from the fourth edge ES4 to an interior region of the base film BF, but may not extend to the third edge ES3.

In various embodiments, the plurality of fifth signal lines SLB12 may be bent along the fourth direction change line DCL4 on the second surface SF2 of the base film BF.

In various embodiments, the plurality of third signal lines SLB11 disposed on the first surface SF1 of the base film BF of the second driving circuit mounting film COFS2 may be connected to the plurality of fifth signal lines SLB12 disposed on the second surface SF2 of the base film BF through the plurality of holes HL in the base film BF.

Referring to FIG. 9 and FIG. 10, unlike the first driving circuit mounting film COFS1 according to the embodiments previously described with reference to FIG. 5 and FIG. 6, the plurality of holes HL for connecting the plurality of third signal lines SLB11 and the plurality of fifth signal lines SLB12 may be disposed almost in a line (aligned) along an oblique direction with respect to the first direction DR1 in the first driving circuit mounting film COFS1 according to the present embodiment. A virtual third line HLL3 passing through the plurality of holes HL may form a predetermined angle with the first direction DR1 and the second direction DR2, where the virtual third line HLL3 may not be a straight line.

According to the various embodiments, the first width W1 of some regions of the base film BF, where the plurality of third signal lines SLB11 are disposed at the second side region SD2 of the second driving circuit portion ICS2, may be wider than the second width W2 of some regions of the base film BF where the plurality of fourth signal lines SLB2 are disposed at the first side region SD1 of the second driving circuit portion ICS2, so that it is possible to secure the region where the desired number of the third signal lines SLB11 may be disposed. In addition, the plurality of signal lines SLB11 and SLB12 disposed at the second side region SD2 of the second driving circuit portion ICS2 may include the plurality of third signal lines SLB11 disposed on the first surface SF1 of the base film BF and the plurality of fifth signal lines SLB12 disposed on the second surface SF2 of the base film BF, and the plurality of third signal lines SLB11 and the plurality of fifth signal lines SLB12 may be electrically connected to each other through the plurality of holes HL of the base film BF. Thus, even if the number of the plurality of signal lines SLB11 and SLB12 disposed at the second side region SD2 of the second driving circuit portion ICS2 increases, a large number of the signal lines SLB11 and SLB12 may be disposed without an increase of a length LA measured along the second direction DR2 of the second driving circuit mounting film COFS2.

Many features of the driving circuit mounting film according to the embodiments previously described with reference to FIGS. 1 to 6 are applicable to the driving circuit mounting film, according to the present embodiment.

Another embodiment will be described with reference to FIGS. 11 to 14.

Figure 11:
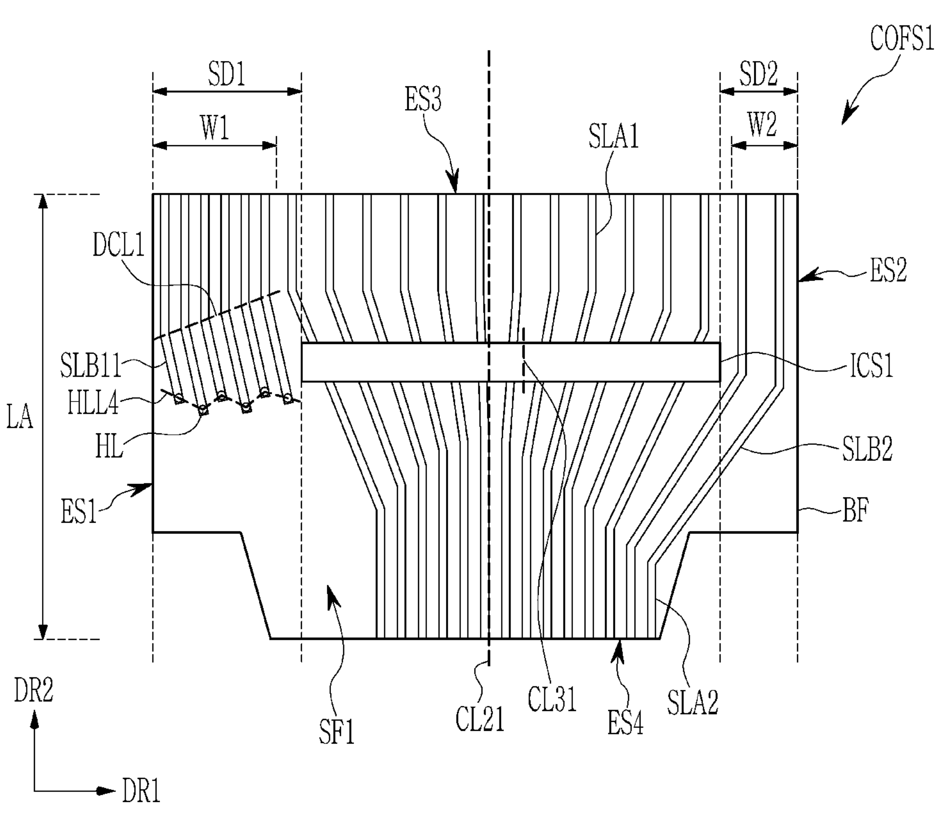
FIG. 11 is a plan view of a first surface of the driving circuit mounting film, according to another embodiment.
Figure 12:
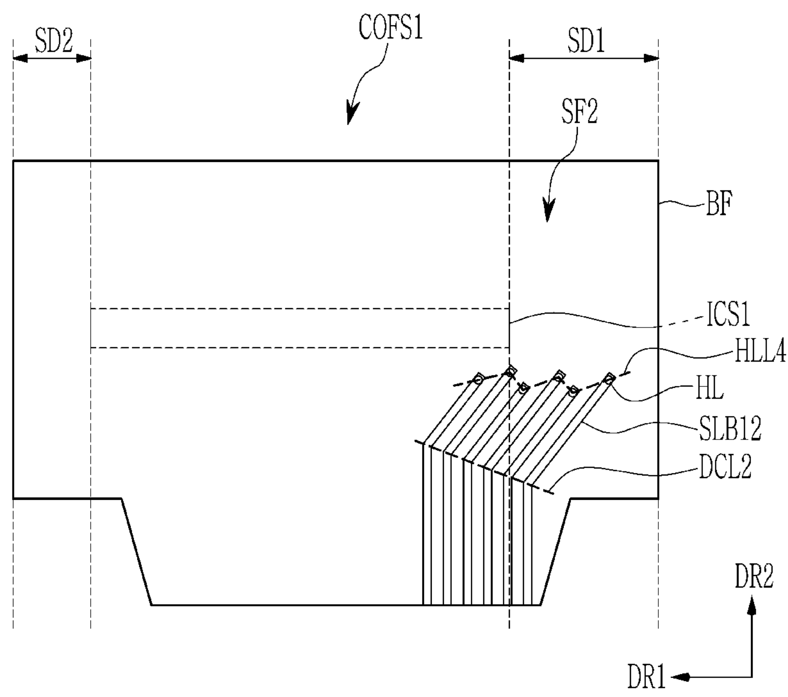
FIG. 12 is a plan view of a second surface of the driving circuit mounting film, according to another embodiment.

Referring to FIG. 11 and FIG. 12, the first driving circuit mounting film COFS1 according to another embodiment will be described. FIG. 11 is a plan view of a first surface of the driving circuit mounting film according to another embodiment, and FIG. 12 is a plan view of a second surface of the driving circuit mounting film according to another embodiment.

Referring to FIG. 11 and FIG. 12, the first driving circuit mounting film COFS1 according to the present embodiment is similar to the first driving circuit mounting film COFS1 according to the embodiments previously described with reference to FIGS. 2 to 4 and the first driving circuit mounting film COFS1 according to the embodiments previously described with reference to FIG. 7 and FIG. 8.

Referring to FIG. 11, the first driving circuit mounting film COFS1 may include the first driving circuit portion ICS1 disposed on the first surface SF1 of the base film BF, the plurality of first signal lines SLA1 and the plurality of second signal lines SLA2 connected to the first driving circuit portion ICS1, and the plurality of third signal lines SLB11 and the plurality of fourth signal lines SLB2 that are not connected to the first driving circuit portion ICS1.

On the plane where the first driving circuit mounting film COFS1 is viewed from above, the plurality of third signal lines SLB11 may be disposed at the first side region SD1 of the first driving circuit portion ICS1 along the first direction DR1, and the plurality of fourth signal lines SLB2 may be disposed at the second side region SD2 of the first driving circuit portion ICS1 along the first direction DR1.

In various embodiments, the plurality of third signal lines SLB11 may extend from the third edge ES3 toward an interior region of the base film BF, but may not extend to the fourth edge ES4.

In various embodiments, the plurality of fourth signal lines SLB2 may extend from the third edge ES3 to the fourth edge ES4.

Along the first direction DR1, the second center line CL21 passing through the first driving circuit mounting film COFS1 and parallel to the second direction DR2, may not coincide with the third center line CL31 passing through the first driving circuit portion ICS1 and parallel to the second direction DR2.

In various embodiments, the first width W1 of some regions of the base film BF, where the plurality of third signal lines SLB11 are disposed at the first side region SD1 of the first driving circuit portion ICS1, may be wider than the second width W2 of some regions of the base film BF, where the plurality of fourth signal lines SLB2 are disposed at the second side region SD2 of the first driving circuit portion ICS1.

In various embodiments, the plurality of third signal lines SLB11 may be bent along the first direction change line DCL1 on the first surface SF1 of the base film BF.

In various embodiments, the plurality of fourth signal lines SLB2 may be bent twice on the first surface SF1 of the base film BF.

Referring to FIG. 12, the first driving circuit mounting film COFS1 may include the plurality of fifth signal lines SLB12 disposed on the second surface SF2 of the base film BF.

In various embodiments, the plurality of fifth signal lines SLB12 may extend from the fourth edge ES4 toward an interior region of the base film BF, but may not extend to the third edge ES3.

In various embodiments, the plurality of fifth signal lines SLB12 may be bent along the second direction change line DCL2 on the second surface SF2 of the base film BF.

In various embodiments, the plurality of third signal lines SLB11 disposed on the first surface SF1 of the base film BF of the first driving circuit mounting film COFS1 may be electrically connected to the plurality of fifth signal lines SLB12 disposed on the second surface SF2 of the base film BF through the plurality of holes HL of the base film BF.

Referring to FIG. 11 and FIG. 12, unlike the first driving circuit mounting film COFS1 according to the embodiments previously described with reference to FIGS. 2 to 4 and the first driving circuit mounting film COFS1 according to the embodiments previously described with reference to FIG. 7 and FIG. 8, the plurality of holes HL for connecting the plurality of third signal lines SLB11 and the plurality of fifth signal lines SLB12 may not be disposed in a line (aligned) along an oblique direction with respect to the first direction DR1 in the first driving circuit mounting film COFS1 according to the present embodiment. A virtual fourth line HLL4 passing through the plurality of holes HL may not be a straight line.

According to the various embodiments, the first width W1 of some regions of the base film BF, where the plurality of third signal lines SLB11 are disposed at the first side region SD1 of the first driving circuit portion ICS1, may be wider than the second width W2 of some regions of the base film BF, where the plurality of fourth signal lines SLB2 are disposed at the second side region SD2 of the first driving circuit portion ICS1, so that it is possible to secure a region where the relatively large number of the third signal lines SLB11 may be disposed. In addition, the plurality of signal lines SLB11 and SLB12 disposed at the first side region SD1 of the first driving circuit portion ICS1 may include the plurality of third signal lines SLB11 disposed on the first surface SF1 of the base film BF and the plurality of fifth signal lines SLB12 disposed on the second surface SF2 of the base film BF, and the plurality of third signal lines SLB11 and the plurality of fifth signal lines SLB12 may be connected to each other through the plurality of holes HL of the base film BF. Thus, even if the number of the plurality of signal lines SLB11 and SLB12 disposed at the first side region SD1 of the first driving circuit portion ICS1 increases, a large number of the signal lines SLB11 and SLB12 may be disposed without an increase of a length LA measured along the second direction DR2 of the second driving circuit mounting film COFS2.

Figure 13:
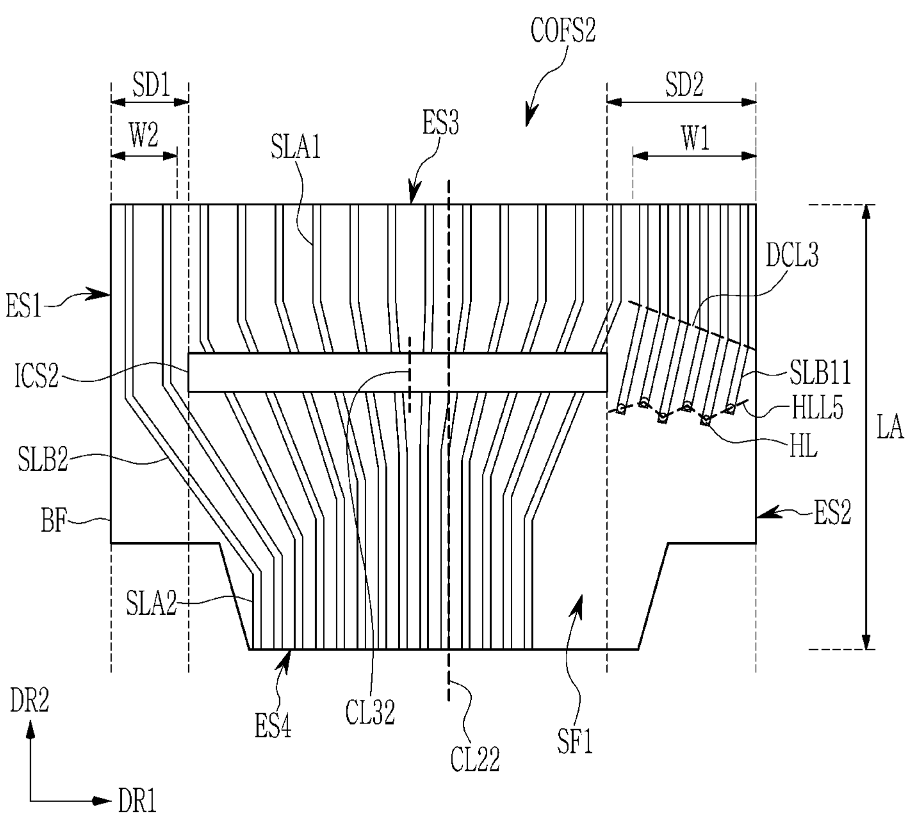
FIG. 13 is a plan view of a first surface of the driving circuit mounting film, according to another embodiment.
Figure 14:
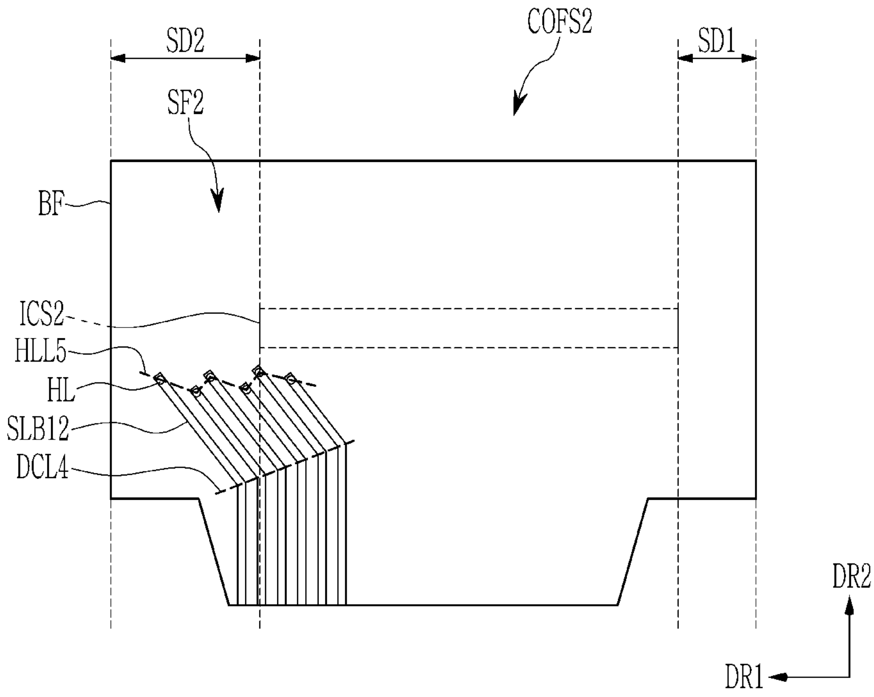
FIG. 14 is a plan view of a second surface of the driving circuit mounting film, according to another embodiment.

Referring to FIG. 13 and FIG. 14, the second driving circuit mounting film COFS2, according to another embodiment will be described. FIG. 13 is a plan view of a first surface of the driving circuit mounting film, according to another embodiment, and FIG. 14 is a plan view of a second surface of the driving circuit mounting film, according to another embodiment.

Referring to FIG. 13 and FIG. 14, the second driving circuit mounting film COFS2 may be similar to the second driving circuit mounting film COFS2, according to the embodiments previously described with reference to FIG. 5 and FIG. 6 and the second driving circuit mounting film COFS2 according to the embodiments previously described with reference to FIG. 9 and FIG. 10.

Referring to FIG. 13, the second driving circuit mounting film COFS2 may include the second driving circuit portion ICS2 disposed on the first surface SF1 of the base film BF, the plurality of first signal lines SLA1 and the plurality of second signal lines SLA2 connected to the second driving circuit portion ICS2, and the plurality of third signal lines SLB11 and the plurality of fourth signal lines SLB2 that are not connected to the second driving circuit portion ICS2.

In various embodiments, the plurality of first signal lines SLA1 may be connected between the display panel DP and the second driving circuit portion ICS2 of FIG. 1 along the third edge ES3, and the plurality of second signal lines SLA2 may be connected between the second driving circuit portion ICS2 and the driving circuit board PB along the fourth edge ES4.

Unlike the first driving circuit mounting film COFS1, on the plane where the second driving circuit mounting film COFS2 is viewed from above, the plurality of third signal lines SLB11 may be disposed at the second side region SD2 of the second driving circuit portion ICS2 along the first direction DR1, and the plurality of fourth signal lines SLB2 may be disposed at the first side region SD1 of the second driving circuit portion ICS2 along the first direction DR1.

In various embodiments, the plurality of third signal lines SLB11 may extend from the third edge ES3 toward an interior region of the base film BF, but may not extend to the fourth edge ES4.

In various embodiments, the plurality of fourth signal lines SLB2 may extend from the third edge ES3 to the fourth edge ES4.

Along the first direction DR1, the fourth center line CL22 passing through the second driving circuit mounting film COFS2 and parallel to the second direction DR2, may not coincide with the fifth center line CL32 passing through the second driving circuit portion ICS2 and parallel to the second direction DR2.

In various embodiments, the first width W1 of some regions of the base film BF, where the plurality of third signal lines SLB11 are disposed at the second side region SD2 of the second driving circuit portion ICS2, may be wider than the second width W2 of some regions of the base film BF, where the plurality of fourth signal lines SLB2 are disposed at the first side region SD1 of the second driving circuit portion ICS2.

In various embodiments, the number of the plurality of third signal lines SLB11 disposed at the second side region SD2 of the second driving circuit portion ICS2 may be greater than the number of the plurality of fourth signal lines SLB2 disposed at the first side region SD1 of the second driving circuit portion ICS2. Therefore, it is possible to secure a region where the relatively large number of the third signal lines SLB11 may be disposed.

In various embodiments, the plurality of third signal lines SLB11 may be bent along the third direction change line DCL3 on the first surface SF1 of the base film BF.

In various embodiments, the plurality of fourth signal lines SLB2 may be bent twice on the first surface SF1 of the base film BF.

Referring to FIG. 14, the first driving circuit mounting film COFS1 may include the plurality of fifth signal lines SLB12 disposed on the second surface SF2 of the base film BF.

In various embodiments, the plurality of fifth signal lines SLB12 may extend from the fourth edge ES4 toward an interior region of the base film BF, but may not extend to the third edge ES3.

In various embodiments, the plurality of fifth signal lines SLB12 may be bent along the fourth direction change line DCL4 on the second surface SF2 of the base film BF.

In various embodiments, the plurality of third signal lines SLB11 disposed on the first surface SF1 of the base film BF of the second driving circuit mounting film COFS2 may be connected to the plurality of fifth signal lines SLB12 disposed on the second surface SF2 of the base film BF through the plurality of holes HL of the base film BF.

Referring to FIG. 13 and FIG. 14, unlike the second driving circuit mounting film COFS2 according to the embodiments previously described with reference to FIG. 5 and FIG. 6 and the second driving circuit mounting film COFS2 according to the embodiments previously described with reference to FIG. 9 and FIG. 10, the plurality of holes HL for connecting the plurality of third signal lines SLB11 and the plurality of fifth signal lines SLB12 may not be disposed in a line (aligned) along an oblique direction with respect to the first direction DR1 in the first driving circuit mounting film COFS1 according to the present embodiment. A virtual fifth line HLL5 passing through the plurality of holes HL may not be a straight line.

According to the present embodiment, the first width W1 of some regions of the base film BF, where the plurality of third signal lines SLB11 are disposed at the second side region SD2 of the second driving circuit portion ICS2, may be wider than the second width W2 of some regions of the base film BF, where the plurality of fourth signal lines SLB2 are disposed at the first side region SD1 of the second driving circuit portion ICS2, so that it is possible to secure the region where the desired number of the third signal lines SLB11 may be disposed. In addition, the plurality of signal lines SLB11 and SLB12 disposed at the second side region SD2 of the second driving circuit portion ICS2 may include the plurality of third signal lines SLB11 disposed on the first surface SF1 of the base film BF and the plurality of fifth signal lines SLB12 disposed on the second surface SF2 of the base film BF, and the plurality of third signal lines SLB11 and the plurality of fifth signal lines SLB12 may be electrically connected to each other through the plurality of holes HL in the base film BF. Thus, even if the number of the plurality of signal lines SLB11 and SLB12 disposed at the second side region SD2 of the second driving circuit portion ICS2 increases, a large number of the signal lines SLB11 and SLB12 may be disposed without an increase of a length LA measured along the second direction DR2 of the second driving circuit mounting film COFS2.

Many features of the driving circuit mounting films according to the embodiments previously described with reference to FIGS. 1 to 10 are all applicable to the driving circuit mounting film according to the present embodiment.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

COFM, COFS1, COFS2: driving circuit mounting film
BF: base film

ICM, ICS1, ICS2: driving circuit portion
PB: driving circuit board
DSP: display device
DP: display panel
SLA1, SLA2, SLB11, SLB12, SLB2: signal line
HL: hole

What is claimed is:

1. A driving circuit mounting film, comprising:

a base film that has a first surface and a second surface opposing each other with a thickness therebetween;

a driving circuit portion on the first surface of the base film;

a plurality of first signal lines on a first side region on one side of the driving circuit portion along a first direction; and a plurality of second signal lines on a second side region on the opposite side of the driving circuit portion along the first direction, wherein a first width of the first side region is greater than a second width of the second side region, the plurality of first signal lines include first portions on the first surface of the base film and second portions on the second surface of the base film, and the first portions and the second portions of the plurality of first signal lines are connected to each other through a plurality of holes in the first side region of the base film.

2. The driving circuit mounting film of claim 1, wherein the plurality of first signal lines and the plurality of second signal lines are not connected to the driving circuit portion.

3. The driving circuit mounting film of claim 1, wherein the plurality of second signal lines are disposed only on the first surface of the base film.

4. The driving circuit mounting film of claim 1, wherein among the first side region and the second side region, the plurality of holes are disposed only in the first side region.

5. The driving circuit mounting film of claim 1, wherein the plurality of holes are disposed along a direction parallel to the first direction.

6. The driving circuit mounting film of claim 5, wherein a virtual first line passing through the plurality of holes is a straight line parallel to the first direction.

7. The driving circuit mounting film of claim 1, wherein the plurality of holes are disposed along an oblique direction with respect to the first direction.

8. The driving circuit mounting film of claim 7, wherein a virtual second line passing through the plurality of holes is a straight line parallel to the oblique direction.

9. The driving circuit mounting film of claim 1, wherein the plurality of holes are not disposed in a line.

10. The driving circuit mounting film of claim 9, wherein a virtual third line passing through the plurality of holes is not a straight line.

11. The driving circuit mounting film of claim 1, wherein the number of the plurality of first signal lines is different from the number of the plurality of second signal lines.

12. The driving circuit mounting film of claim 11, wherein the number of the plurality of first signal lines is greater than the number of the plurality of second signal lines.

13. The driving circuit mounting film of claim 1, wherein the first width is about 1.5 times to about 4.5 times the second width.

14. The driving circuit mounting film of claim 13, wherein the first width is about three times the second width.

15. The driving circuit mounting film of claim 1, further comprising a plurality of third signal lines disposed on the first surface of the base film and connected to the driving circuit portion.

16. The driving circuit mounting film of claim 1, wherein the plurality of second signal lines are disposed only on the first surface of the base film among the first surface and the second surface of the base film.

* * * * *